(12) United States Patent
Petrie

(10) Patent No.: US 8,907,669 B2
(45) Date of Patent: Dec. 9, 2014

(54) CIRCUITS AND TECHNIQUES FOR ADJUSTING A SENSITIVITY OF A CLOSED-LOOP CURRENT SENSOR

(75) Inventor: Craig S. Petrie, Merrimack, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 254 days.

(21) Appl. No.: 13/556,663

(22) Filed: Jul. 24, 2012

(65) Prior Publication Data

US 2014/0028290 A1     Jan. 30, 2014

(51) Int. Cl.
*G01R 33/06* (2006.01)

(52) U.S. Cl.
USPC .......................................... 324/251; 324/252

(58) Field of Classification Search
CPC .............................. G01R 19/20; G01R 33/022
USPC ................................................. 324/251, 252
See application file for complete search history.

(56) References Cited

U.S. PATENT DOCUMENTS

| | | | |
|---|---|---|---|
| 7,057,485 B2 * | 6/2006 | Preusse et al. ................. | 336/173 |
| 7,250,748 B2 * | 7/2007 | Hastings et al. .......... | 324/117 R |
| 7,746,056 B2 | 6/2010 | Stauth et al. | |
| 7,923,996 B2 | 4/2011 | Doogue et al. | |
| 8,030,918 B2 | 10/2011 | Doogue et al. | |
| 2010/0211347 A1 | 8/2010 | Friedrich et al. | |
| 2011/0018533 A1 | 1/2011 | Cesaretti et al. | |

OTHER PUBLICATIONS

Cesaretti et al.; "Circuits and Methods for Self-Calibrating or Self-Testing a Magnetic Field Sensor;" U.S. Appl. No. 13/095,371, filed Apr. 27, 2011; 62 pages.
Cesaretti et al.; "Circuits and Methods Using Adjustable Feedback for Self-Calibrating or Self-Testing a Magnetic Field Sensor with an Adjustable Time Constraint;" U.S. Appl. No. 13/398,127, filed Feb. 16, 2012; 85 pages.

* cited by examiner

*Primary Examiner* — Reena Aurora
(74) *Attorney, Agent, or Firm* — Daly, Crowley, Mofford & Durkee, LLP

(57) ABSTRACT

A closed loop current sensor has a primary conductor and a plurality of secondary conductors. Selected ones of the plurality of secondary conductors are selected and driven in a feedback loop.

29 Claims, 12 Drawing Sheets

CIRCUITS AND TECHNIQUES FOR ADJUSTING A SENSITIVITY OF A CLOSED-LOOP CURRENT SENSOR

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to current sensors and, more particularly, to a closed-loop current sensor having a feedback arrangement with selectable feedback magnetic coupling.

BACKGROUND OF THE INVENTION

Various types of current sensors are known.

In an open loop current sensor, a magnetic field generated by a sensed electrical current passing through a conductor is sensed with one or more magnetic field sensing elements. The open loop current sensor does not provide a feedback path such as that described below in conjunction with a closed loop current sensor.

In a closed loop current sensor, similarly, a primary magnetic field generated by a sensed electrical current passing through a primary conductor is sensed with one or more magnetic field sensing elements. However, in the closed loop current sensor, the one or more magnetic field sensing elements are also responsive to a secondary magnetic field generated by another electrical current passing through a secondary conductor disposed in a feedback arrangement. Thus, the one or more magnetic field sensing elements are responsive to a sum of the primary magnetic field and the secondary magnetic field. In the dosed loop current sensor, a magnitude of the secondary magnetic field is related to a magnitude of the primary magnetic field. In some embodiments, the secondary magnetic field and the primary magnetic field are equal in magnitude and opposite in sign, so that the stun of these fields, sensed by the one or more magnetic field sensing elements, is near zero.

Referring now to FIG. 1, a closed-loop current sensor 10 includes a magnetic sensing element 22, for example, a giant magnetoresistance (GMR) element. The magnetic field sensing element 22 is configured to generate a magnetic-field-responsive signal 22a. The closed-loop current sensor 10 also includes a primary conductor 12 configured to conduct a primary current 14, i.e., a sensed current 14, between two nodes 16, 18. The two nodes 16, 18 can, for example, correspond to pins of an integrated circuit.

In some embodiments, the primary conductor 12 comprises a coupling of two pins of an integrated circuit, for example, by way of a coupling of leads of a leadframe of the integrated circuit. This arrangement is described more fully below in conjunction with FIGS. 11 and 12.

The closed loop current sensor 10 also includes an amplifier 24 coupled to receive the magnetic-field-responsive signal 22a and configured to generate an amplified signal 24a. A transconductance amplifier 26 is coupled to receive the amplified signal 24a and configured to generate a current signal 26a. A secondary conductor 20 is coupled to receive the current signal 26a at one end, and is coupled to a node 28 at another end. The node 28 can, in some embodiments, correspond to another input of the integrated circuit.

A resistor 30 is also coupled to the node 28. Thus, in some embodiments, the resistor 30 is outside of the integrated circuit. A voltage signal 32 is generated by the current signal 26a passing through the resistor 30.

The closed-loop current sensor 10 is responsive to a primary magnetic field generated by the primary current 14, $I_P$, passing through the primary conductor 12, and also responsive to a secondary magnetic field generated by the current signal 26a, $I_C$, passing through the secondary conductor 20. The closed loop current sensor 10 uses negative feedback to generate the secondary current, $I_C$, which, in turn, generates the secondary magnetic field, which can be oriented to oppose, at the magnetic field sensing element 22, the primary magnetic field generated by the primary current, $I_P$. The secondary current 26a, $I_C$, is proportional to the input (i.e., sensed) current 14, $I_P$, as follows:

$$I_C = \frac{k_P}{k_C} \frac{A_L}{1+A_L} I_P, \qquad (1)$$

where:

$$A_L = g_m k_C k_G A_0, \qquad (2)$$

and where:
$k_P$=primary conductor coupling factor;
$k_C$=secondary conductor coupling factor;
$A_L$=loop gain;
$g_m$=transconductance of the transconductance amplifier 26;
$k_G$=magnetic sensor gain; and
$A_0$=low-frequency open loop gain of the amplifier 24

If the low frequency open loop gain, $A_0$, is selected to be very large so that $A_L \gg 1$, the sensitivity, $S_I = I_C/I_P$, of the closed-loop current sensor depends only upon the coupling factors, $k_P$ and $k_C$:

$$S_I \approx \frac{I_C}{I_P} = \frac{k_P}{k_C}. \qquad (3)$$

Typically, $k_P \ll k_C$ and the secondary current, $I_C$, 26a is a small fraction of the primary current, $I_P$, 14. Coupling factors $k_P$ and $k_C$ are generally insensitive to temperature, supply and package stress variations. Sensitivity is, therefore, stable and sensitivity drift is low. However, $k_C$ and especially $k_P$ will vary due to tolerances (e.g., positional tolerances) in IC fabrication and packaging. One-time factory sensitivity trim is often necessary to compensate for these variations.

The secondary current, $I_C$, 26a can be routed through the sense resistor 30 to produce the magnetic field sensor output voltage signal 32. Voltage-output sensitivity is described by:

$$S_V = \frac{v_0}{I_P} = \frac{k_P}{k_C} R_S, \qquad (4)$$

which indicates dependence upon a value, $R_S$, of the resistor 30. Sensitivity can be trimmed to account for fabrication and packaging variations by adjusting a value of the resistor 30, but this cannot be properly done in the factory if an external resistor is used.

In order to maintain low sensitivity drift of the magnetic field sensor 10, it is desirable that the resistor 30 be a precision resistor external to the current sensor 10. Trimming can be performed by adding an internal programmable-gain amplifier that senses the voltage across the resistor 30, but this comes at the expense of an extra package pin, extra circuit area, and unwanted offset errors introduced by the extra circuitry.

The only remaining method for trimming sensitivity in a closed loop magnetic current sensor is to change one of the coupling factors, $k_P$ or $k_C$. The coupling factor, $k_P$, associated with the primary conductor 12 tends to be fixed by integrated circuit packaging structure and dimensions and cannot be easily altered. In particular, it is often desirable that the primary conductor 12 be relatively large so as to provide a relatively low resistance, thereby allowing a relatively high value of the primary (i.e., sensed) current 14. The coupling factor, $k_P$, associated with the secondary conductor 20 tends to be fixed by integrated circuit fabrication and is also difficult to alter for trimming.

It would be desirable to provide a closed loop current sensor for which a sensitivity can be adjusted by way of adjusting a coupling factor.

SUMMARY OF THE INVENTION

The present invention provides a closed-loop current sensor for which a sensitivity can be adjusted by way of adjusting a coupling factor.

In accordance with one aspect of the present invention, an electronic circuit for measuring a sensed current includes a primary current conductor for carrying the sensed current. The electronic circuit also includes a magnetic field sensing element disposed proximate to the primary conductor. The sensed current passing through the primary conductor results in a first magnetic field at the magnetic field sensing element. The electronic circuit also includes a plurality of secondary conductors disposed proximate to the magnetic field sensing element, each at a different position relative to the magnetic field sensing element. The electronic circuit also includes a plurality of drive circuits, each one of the plurality of drive circuits coupled to a respective one of the plurality of secondary conductors. The electronic circuit also includes a selection circuit coupled to the plurality of drive circuits and operable to select ones of the plurality of drive circuits causing the selected drive circuits to drive respective currents through respective selected ones of the plurality of secondary conductors. The currents passing through the selected ones of the plurality of secondary conductors result in a second magnetic field at the magnetic field sensor. A magnitude of the second magnetic field is related to the selection made by the selection circuit. The magnetic field sensor is responsive to a summed magnetic field corresponding to a sum of the first and second magnetic fields. The selection made by the selection circuit results in a selected sensitivity of the magnetic field sensor to the sensed current.

In accordance with another aspect of the present invention, a method of measuring a sensed current includes providing, in an integrated circuit, a magnetic field sensing element. The method also includes providing a primary current conductor for carrying the sensed current. The sensed current passing through the primary conductor results in a first magnetic field at the magnetic field sensing element. The method also includes providing a plurality of secondary conductors disposed proximate to the magnetic field sensing element, each at a different position relative to the magnetic field sensing element. The method also includes providing, in the integrated circuit, a plurality of drive circuits, each one of the plurality of drive circuits coupled to a respective one of the plurality of secondary conductors. The method also includes providing, in the integrated circuit, a selection circuit coupled to the plurality of drive circuits. The method also includes selecting, with the selection circuit, ones of the plurality of drive circuits causing the selected drive circuits to drive respective secondary currents through respective selected ones of the plurality of secondary conductors. The secondary currents passing through the selected ones of the plurality of secondary conductors result in a second magnetic field at the magnetic field sensor. A magnitude of the second magnetic field is related to the selection made by the selection circuit. The magnetic field sensor is responsive to a summed magnetic field corresponding to a sum of the first and second magnetic fields. The selection made by the selection circuit results in a selected sensitivity of the magnetic field sensor to the sensed current.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an indium compound, e.g., Indium-Antimonide (InSb).

While examples shown below use magnetoresistance elements, it is possible to apply similar circuits and techniques to other types of magnetic field sensing elements. In some embodiments that use a magnetic field sensing element that has a different major axis of sensitivity than the magnetoresistance elements shown below, secondary conductors shown below can be positioned differently with respect to the different magnetic field sensing element to achieve similar results.

Figure 1:
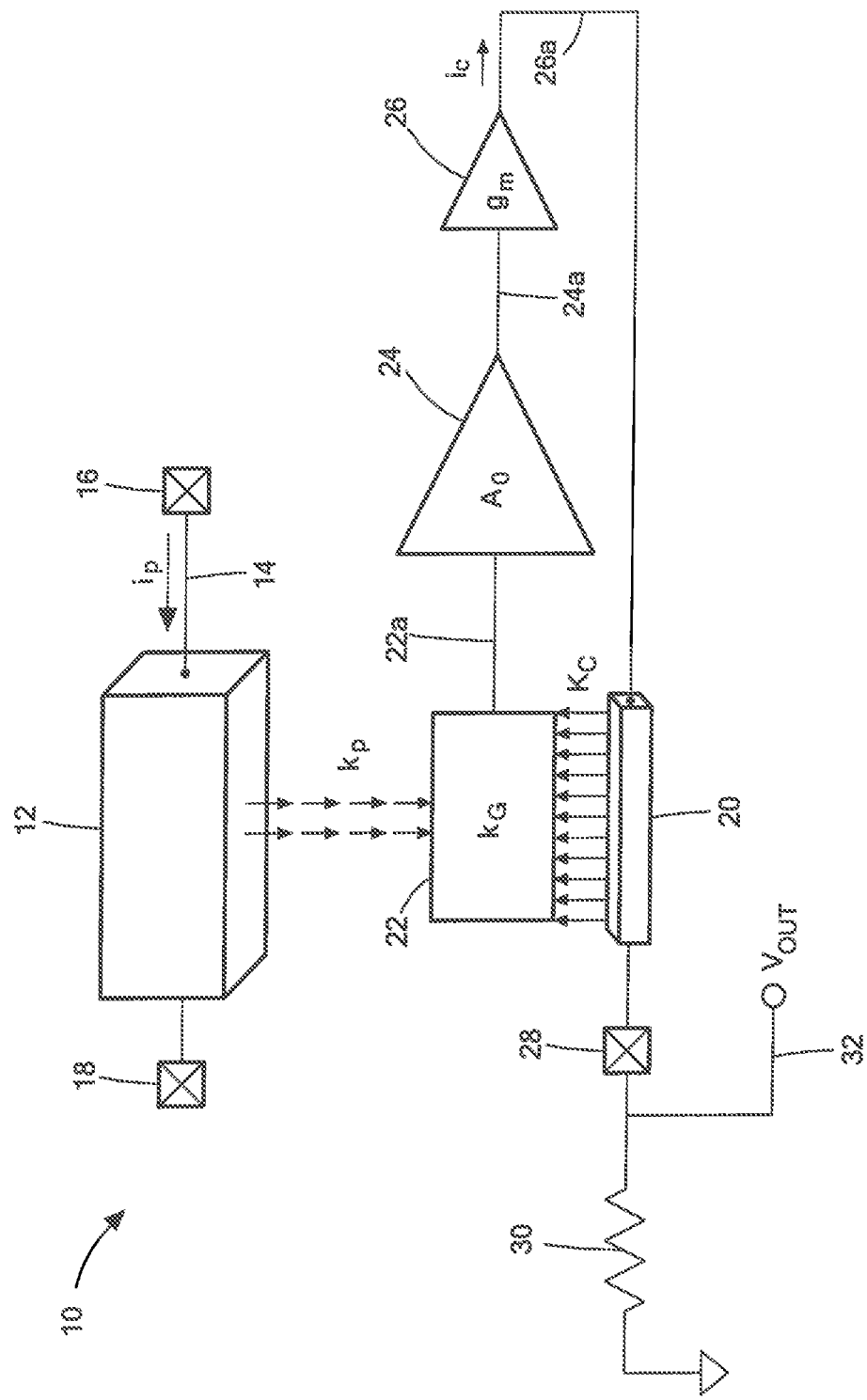
FIG. 1 is a block diagram showing a conventional closed loop current sensor.

Retelling briefly to FIG. 1, the coupling factor, $k_C$, between the secondary conductor 20 and the magnetic field sensing element 22 depends on physical spacing of the secondary conductor 20 relative to the magnetic field sensing element 22.

Figure 2:
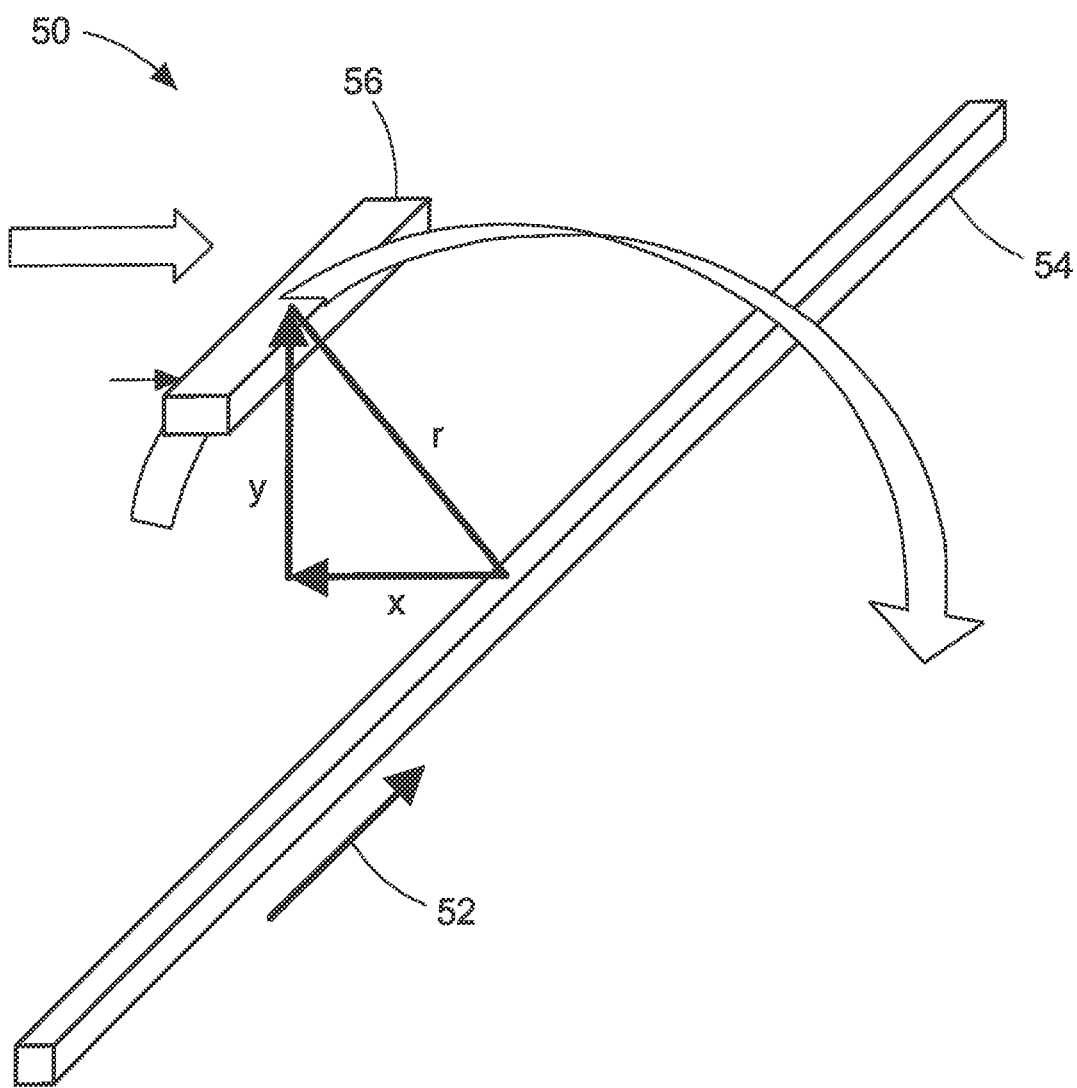
FIG. 2 is a pictorial showing a current-carrying conductor proximate to a magnetic field sensing element.

Referring now to FIG. 2, a current 52 is shown passing through a conductor 54. The conductor 54 is at a certain location (x,y) relative to the magnetic field sensing element 56.

It should be appreciated here and in magnetic field sensors described more fully below that the conductor 54 can be a straight-fine conductor as shown or a coil having any number of turns.

The conductor 54 generates a magnetic field that is circular and generally perpendicular to the magnetic field sensing element, and generally uniform along the length of the conductor 54. The magnetic field sensing element 56 can be responsive to magnetic fields in the ±x-direction only, as is the case for many types of magnetoresistance sensing elements. A magnetic field coupling factor, $k_c$, exists between the conductor 54 and the magnetic field sensing element 56.

Assuming that the cross sections of the conductor 54 and of the magnetic field sensing element 56 are very small, the magnetic field sensed by the magnetic field sensing element 56 is given by:

$$B_x(x, y) = \frac{\mu_0 I_C}{2\pi} \cdot \frac{y}{x^2 + y^2}, \quad (5)$$

where $\mu_0$ is the permeability of the material separating the conductor 54 and the magnetic field sensing element 56 and $I_C$ is the current flowing in the conductor. The coupling factor, $k_C$, is determined by the (x,y) placement of the conductor 54 relative to the magnetic field sensing element 56 as follows:

$$k_C = \frac{B_x}{I_C} = \frac{\mu_0}{2\pi} \cdot \frac{y}{x^2 + y^2}. \quad (6)$$

Coupling is generally inversely proportional to the vertical distance, y, and generally inversely proportional to the square of the horizontal distance, x.

According to equation (6), it would appear that any trim mechanism that varies the coupling factor, $k_C$, must vary (x,y), the physical position of the conductor 54 relative to the magnetic field sensing element 56. This is not practical in an integrated circuit, where metal traces and other conductors remain fixed in position after fabrication.

However, as described more fully below in conjunction with FIG. 3, the coupling factor, $k_C$, can instead be varied or adjusted by selecting various subsets of a plurality of secondary conductors.

Figure 3:
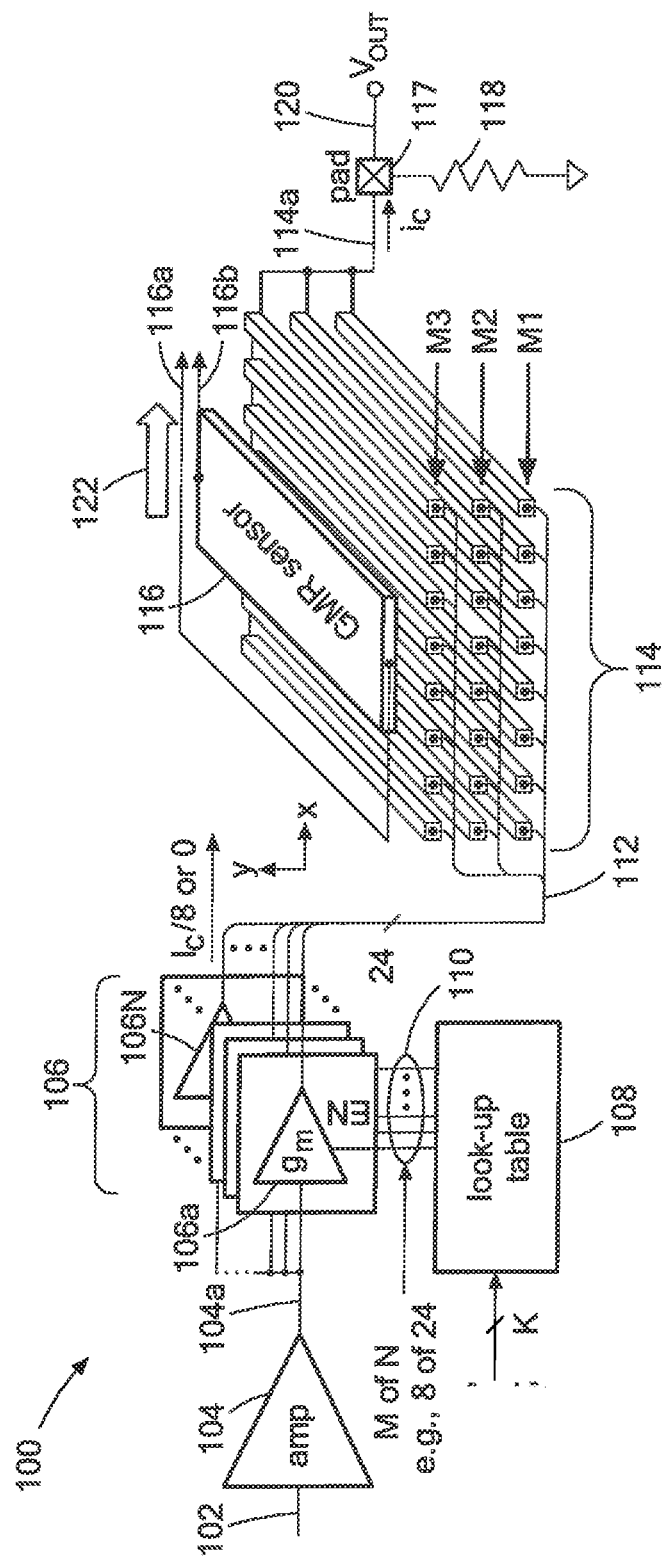
FIG. 3 is a block diagram showing a closed loop current sensor having a plurality of secondary conductors from which is selected a group of secondary conductors from among the plurality of secondary conductors, the closed loop current sensor having a plurality of drive circuits.

Referring now to FIG. 3, an electronic circuit 100 forms a part of a closed loop current sensor. The electronic circuit 100 can include in amplifier 104 coupled to receive a signal 102. The amplifier 104 can be the same as or similar to the amplifier 24 of FIG. 1. The amplifier 104 is configured to generate an output signal 104a. The output signal 104a is coupled to a plurality of transconductance amplifiers 106. As shown, there are N transconductance amplifiers 106a-106N. Each one of the transconductance amplifiers 106a-106N is configured to generate a respective output current signal, collectively identified by a reference designator 112. In the embodiment shown, there are twenty-four such current signals. However, in other embodiments, there can be more than or fewer than twenty-four current signals.

The electronic circuit 100 can include a plurality of secondary current conductors, here collectively identified by a reference designator 114. In the embodiment shown, there are twenty-four secondary conductors 114 (N=24), arranged in three layers, each layer having eight secondary conductors. In other embodiments, there can be more than or fewer than twenty-four secondary conductors. The plurality of transconductance amplifiers 106 is also referred to herein as a plurality of "drive circuits," operable to drive respective currents into the plurality of secondary conductors 114.

In some embodiments, some of the plurality of secondary conductors 114 are formed in a first metal layer, M1, of a substrate of an integrated circuit, other ones the plurality of secondary conductors 114 are formed in a second metal layer, M2, of a substrate of the integrated circuit, and still other ones of the plurality of secondary conductors 114 are formed in a third metal layer, M3 of the substrate of the integrated circuit. In the embodiment shown, there are eight secondary conductors in each of the metal layers.

In some embodiments as shown, the secondary conductors 114 are disposed under the magnetic field sensing element 116, which is disposed over a substrate, for example, a silicon substrate. However, in other embodiments, some of the secondary conductors 114 are disposed over the magnetic field sensing element 116.

Currents flowing through the plurality of secondary conductors 114 are summed to provide an output current signal 114a that flows through a node 117. The node 117 can correspond, for example, to a pin of the integrated circuit. A resistor 118 can be coupled between the node 117 and ground, resulting in a voltage output signal 120 at the node 117.

Instead of driving a single transconductance amplifier as in FIG. 1, the amplifier 104 drives N=24 matched transconductance amplifiers 106, only M=8 of which are active. The selection of eight of the transconductance amplifiers 106 is made via an enable signal 110. Each transconductance amplifier 106 drives a respective one of the secondary conductors 114.

Each one of the secondary conductors 114 has a different position relative to the magnetic field sensing element 116. The selection of which eight transconductance amplifiers 106 are active is made in accordance with a value, K corresponding to sensitivity trim bits stored in a look-table, i.e., a storage device 108. Thus, the storage device 108 is also referred to herein as a "selection circuit" coupled to the plurality of transconductance amplifiers 106. The storage device 108 is operable to select ones of the plurality of transconductance amplifiers 106 causing the selected transconductance amplifiers 106, when selected, to drive respective currents through respective selected ones of the plurality of secondary conductors 114.

The overall coupling factor, $k_C$, between the plurality of secondary conductors 114 and the magnetic field sensing element 116, which is realized by the selection of eight secondary conductors, is a sum of the coupling factors of the individual selected secondary conductors 114. The selection of which ones of the secondary conductors 114 of FIG. 3 should be enabled, via associated transconductance amplifiers 106, for each trim code value 110 is based on values of coupling factors of individual ones of the plurality of secondary conductors 114 of FIG. 3.

Though the electronic circuit 100 requires a plurality of transconductance amplifiers 106, these transconductance amplifiers 106 can be simple circuits described more fully below.

In a closed loop current sensor, the exact value, $g_m$, of the transconductance of the transconductance amplifiers 106, is not critical. The value of the transconductance affects the loop gain, $A_L$, but, as seen in Eqs. (1-3), $A_L$ does not affect sensitivity of the closed loop current sensor if $A_L \gg 1$. Therefore, the transconductance amplifiers 106 can be simple MOS transistor circuits described more fully below in conjunction with FIG. 4.

The magnetic field sensing element 116, here shown to be a magnetoresistance element, is configured to generate a differential output signal 116a, 116b. By inspection of the closed loop current sensor 10 of FIG. 1, it will be understood that the signal 102 can be derived from the differential output signal 116a, 116b. In some embodiments, the secondary conductors 114 can be placed under multiple sensing elements, which can then be arranged in a Wheatstone bridge formation to produce signal the 102.

While twenty four secondary conductors 114 are shown, in other embodiments, there can be more than or fewer than twenty-four secondary conductors. Also, while eight secondary conductors are selected and driven, in other embodiments, more than eight or fewer than eight secondary conductors can be selected and driven.

A primary current conductor is not shown in FIG. 3. However, in order to form a closed loop current sensor, a primary conductor can be disposed proximate to the magnetic field sensing element 116. In some embodiments, the primary conductor is formed as a part of an integrated circuit package, for example, by coupling of leads of a lead frame. In other embodiments, the primary conductor is formed as a separate piece of an integrated circuit. In still other embodiments, the primary conductor is formed by a conductor upon a circuit board to which the electronic circuit 100 mounts. Various exemplary arrangements are described below in conjunction with FIGS. 10-12.

Figure 4:
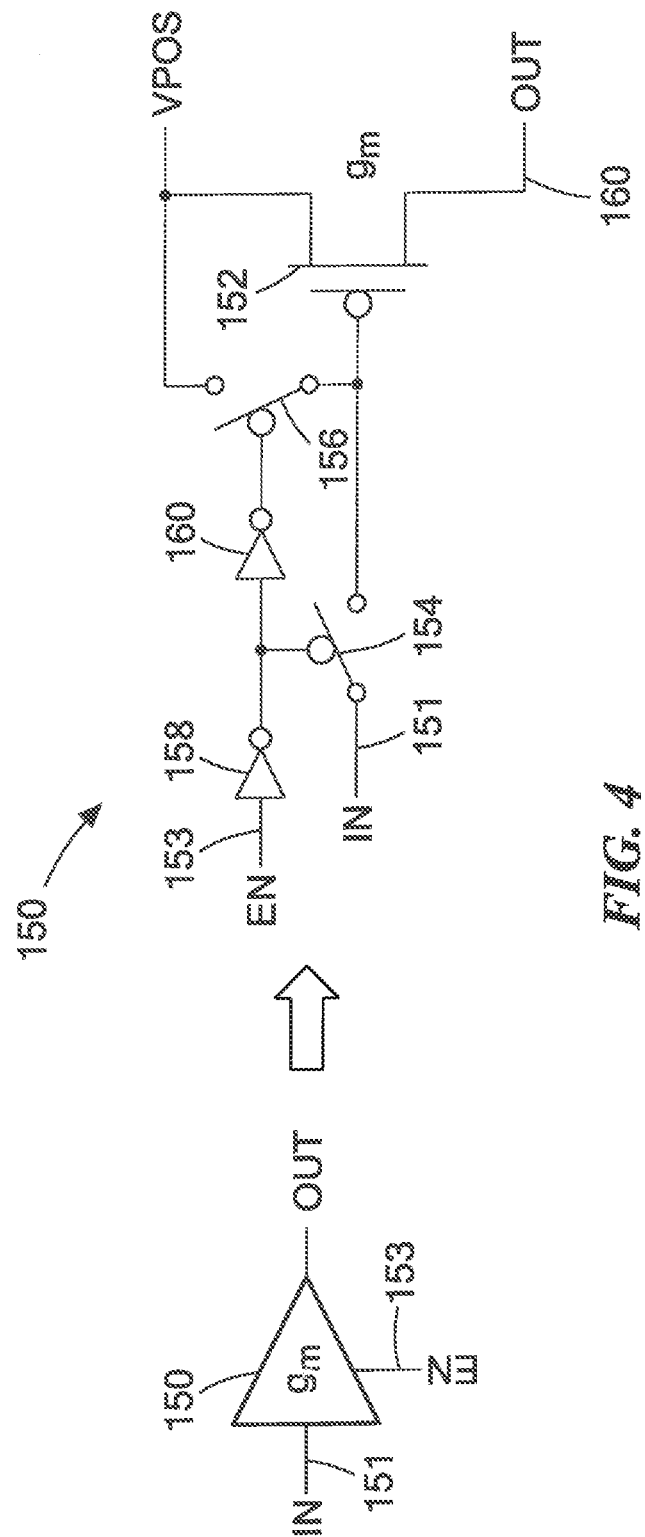
FIG. 4 is a block diagram showing an electronic circuit that can be used as one of the drive circuits of the closed loop current sensor of FIG. 3.

Referring now to FIG. 4, the transconductance amplifiers 106 of FIG. 3 can each be formed as a transconductance amplifier 150. The transconductance amplifier 150 can be coupled to receive an input signal, corresponding to the amplified signal 104a of FIG. 3. The transconductance amplifier 150 can also be coupled to receive an enable signal 153 corresponding to one of the enable signals 110 of FIG. 3.

The transconductance amplifier 150 can be formed from a PMOS device 152. When the enable signal 153 is in a first digital state, a switch 156 is open and a switch 154 is closed. This arrangement of switches results in the input signal 151 appearing on the gate of the PMOS device 152 when the enable signal 153 is in the first digital state. An output current signal 160 is generated at the drain of the PMOS device 152.

Conversely, when the enable signal 153 to the transconductance amplifier 150 is in a second digital state, the gate of the PMOS device 152 is disconnected from the input signal 151, and the gate is switched to a power supply. VPOS, via a switch 156, turning off the current output signal 160 from the transconductance amplifier 150.

The PMOS transistors that can form the bank of N transconductance amplifiers 106 of FIG. 3 should be well matched. It is critical that the output current values of transconductance amplifiers that are enabled match well over temperature, process and stress variations. Well-known circuit and layout techniques such as source degeneration, chopping and common-centroid layout can be employed to enhance the matching of the transconductance amplifiers 106.

Figure 5:
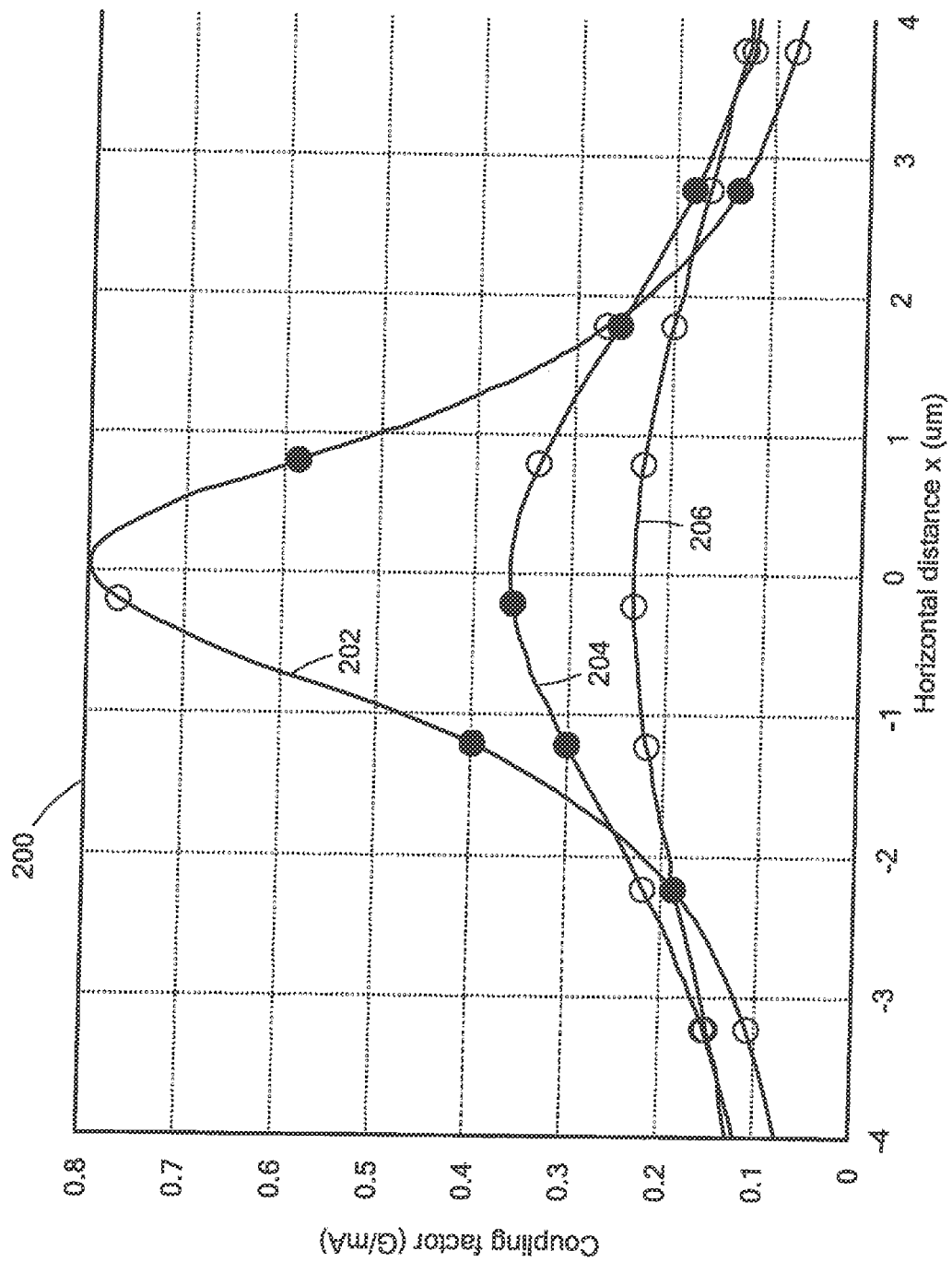
FIG. 5 is a graph showing coupling factors derived by geometric considerations that can be achieved by individual ones of the selected group of secondary conductors of FIG. 3.

Referring now to FIG. 5, a graph 200 has a horizontal axis with a scale in units of horizontal distance, x, in micrometers. The horizontal distance, x, is representative of a horizontal position of a secondary conductor (114, FIG. 3) in relation to a position of a magnetic field sensing element (116, FIG. 3).

The graph 200 also has a vertical axis with a scale indicative of coupling factor in units of Gauss per milliamp. Curves 202, 204, 206 are representative of secondary conductor coupling factor versus horizontal position as given above by Eq. 6, each curve for a different vertical position. The curve 206 is associated with the secondary conductors 114 shown in the metal one, M1, layer in FIG. 3 with a displacement from the magnetic field sensing element in the y direction of 4.25 µm, the curve 204 is associated with the secondary conductors 114 shown in the metal two, M2, layer with a displacement in the y direction of 2.75 µm, and the curve 202 is associated with the secondary conductors 114 shown in the metal three, M3, layer with a displacement in the y direction of 1.25 µm.

A set of points upon the curves 202, 204, 206 represents horizontal placements for the N=24 secondary conductors 114 shown above in FIG. 3. The secondary conductors are spaced 1 µm apart in the x direction and 1.5 µm apart in the y direction. The group of secondary conductor locations is offset from the center of the magnetic field sensing element 116 in order to provide more choices of individual coupling factor values. The offset also permits higher resolution in the programming choices for coupling factor, $k_C$, formed from the sum of the individual coupling factor values.

A set of solid points in FIG. 5 represents a particular selection of M=8 of the secondary conductors 114 (FIG. 3), resulting in a total coupling factor of about 2.17 G/mA, which is the sum of the individual coupling factors of the selected conductors.

Figure 6:
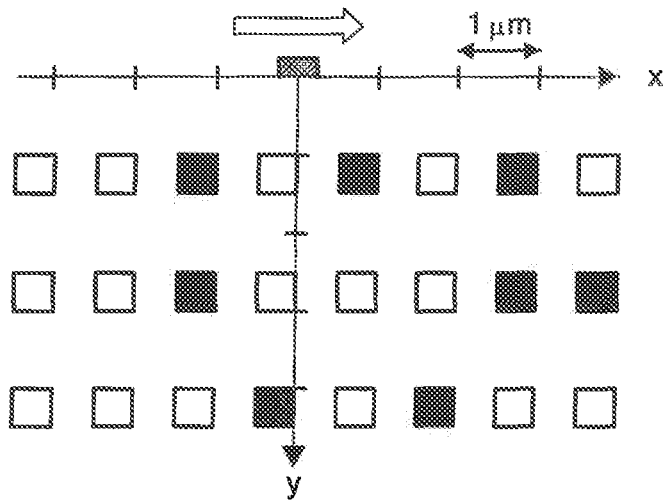
FIGS. 6-6B show respective cross sections of the plurality of secondary conductors of FIG. 3, and showing different selected groups of the secondary conductors that can be driven with a secondary current.

Referring now to FIG. 6, a cross section of the exemplary embodiment of secondary conductors, in which there are twenty-four secondary conductors, shows a particular selection of eight of the secondary conductors, which are driven with currents. The selected eight secondary conductors are represented by solid boxes. These solid boxes correspond to the set of solid points in FIG. 5. The resulting coupling factor between the selected eight secondary conductors and the magnetic field sensing elements 116 of FIG. 3 again is 2.17 Gm/A.

Figure 6A:
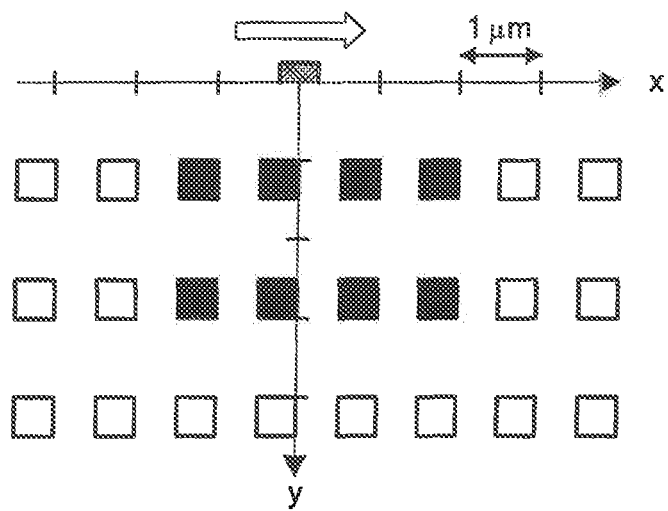

Referring now to FIG. 6A, another cross section of the exemplary embodiment of secondary conductors, in which there are twenty-four secondary conductors, shows another particular selection of eight of the secondary conductors, which are driven with currents, resulting in a maximum coupling factor. The selected eight secondary conductors are represented by solid boxes. The resulting coupling factor between the selected eight secondary conductors and the magnetic field sensing elements 116 of FIG. 3 is about 3.29 G/mA.

Figure 6B:
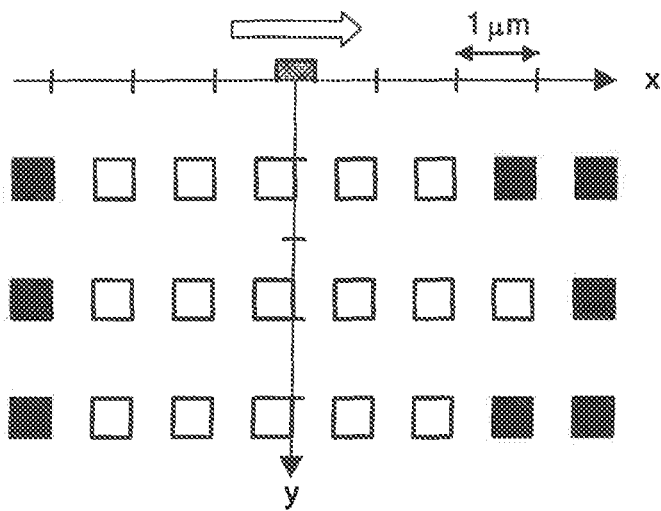

Referring now to FIG. 6B, yet another cross section of the exemplary embodiment of secondary conductors, in which there are twenty-four secondary conductors, shows yet another particular selection of eight of the secondary conductors, which are driven with currents, resulting in a minimum coupling factor. The selected eight secondary conductors are represented by solid boxes. The resulting coupling factor between the selected eight secondary conductors and the magnetic field sensing elements 116 of FIG. 3 is about 1.04 G/mA.

While twenty-four secondary conductors are shown above in conjunction with FIGS. 6, 6A, and 6B, in other embodiments, there can be more than or fewer than twenty-four secondary conductors. Also, while eight secondary conductors are selected and driven, in other embodiments, more than eight or fewer than eight secondary conductors can be selected and driven. A reduced embodiment is described below in conjunction with FIG. 8.

Eq. 6 above is valid for secondary conductors for which a width and a thickness are very small relative to a spacing between the secondary conductors and the magnetic field sensing element. In typical IC fabrication processes, this is not the case and coupling factors are substantially different than those shown above in conjunction with FIG. 5.

Figure 7:
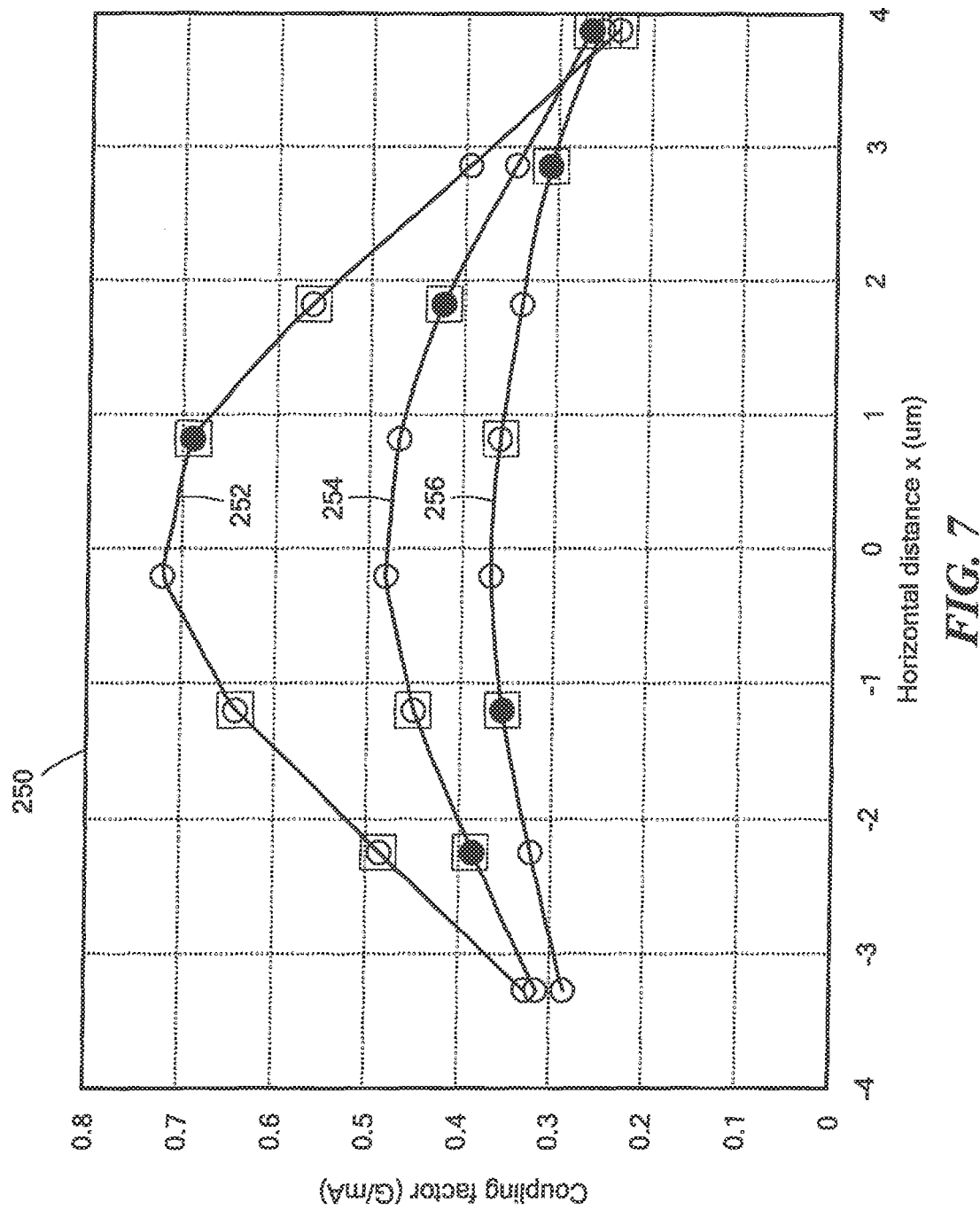
FIG. 7 is a graph showing coupling factors derived by magnetic modeling that can be achieved by individual ones of the selected group of secondary conductors of FIG. 3.

Referring now to FIG. 7, a graph 250 has a horizontal axis with a scale in units of horizontal distance, x, in micrometers. The graph 250 also has a vertical, axis with a scale indicative of coupling factor in units of Gauss per milliamp. Curves 252, 254, 256 are representative of secondary conductor coupling factor versus horizontal position as simulated in a 3-D magnetic modeling simulation program.

The curve 256 is associated with the secondary conductors 114 shown in the metal one, M1, layer in FIG. 3 with a displacement from the magnetic field sensing element in the y direction of 4.25 µm, the curve 254 is associated with the secondary conductors 114 shown in the metal two, M2, layer with a displacement in the y direction of 2.75 µm, and the curve 252 is associated with the secondary conductors 114 shown in the metal three, M3, layer with a displacement in the y direction of 1.25 µm.

The curves 252, 254, 256 assume that the magnetic field sensing element is 4 µm in size. Comparing the graph 250 with the ideal model shown above in the graph 200 of FIG. 5, the simulated model of FIG. 7 demonstrates less variation of field strength in both x and y directions, resulting in more uniform choices for the individual coupling factors.

The simulated coupling factor values of FIG. 7 can be used to design a practical sensitivity trim system based on the circuit topology of FIG. 3. Exemplary goals for the trim system are listed below in Table 1. For uniformly-spaced trim values, the maximum trim error is equal to half a step size, or +/−0.625% in this example. However, factory trim codes do not need to produce uniformly spaced outputs as long as the maximum trim error target (+/−1% in this example) is met.

For this architecture, the maximum trim error can approach its ideal half step size value if more choices of secondary conductor positions are available, i.e., if larger values of M and N are used. For most practical applications, trim uniformity is not critical and both M and N can be decreased, reducing the number of used and unused secondary conductors and associated transconductance amplifiers. Circuit reduction is desirable in order to reduce circuit area, power consumption, and circuit noise.

TABLE 1

| Parameter | Specification |
| --- | --- |
| Trim range | +/−20% |
| Trim bits | 5 |
| LSB size | ~1.25% |
| Maximum trim error | +/−1% |

Figure 8:
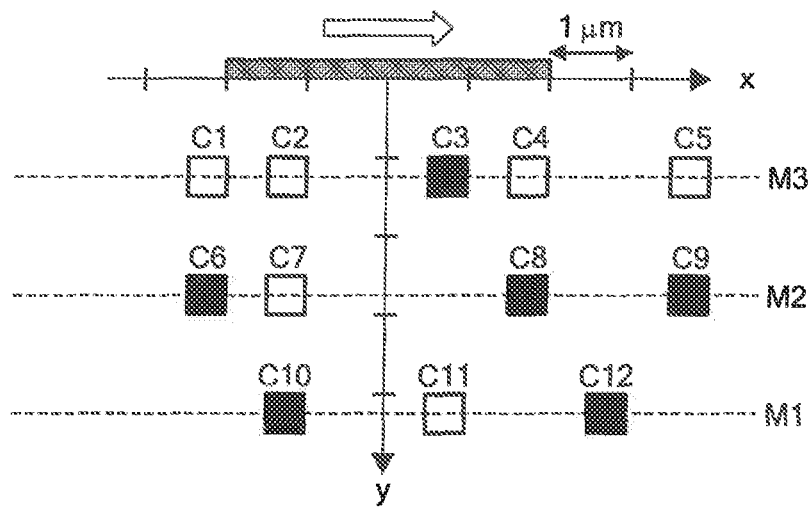
FIG. 8 shows a cross section of the plurality of secondary conductors of FIG. 3, and showing a selected group of the secondary conductors that can be driven with a secondary current.

Referring now to FIG. 8, an exemplary arrangement of a reduced number (N=12) of secondary conductors is shown with boxes drawn in the positions of the conductors within the three metal layers. These boxes correspond to the boxes drawn around the points of FIG. 7. FIG. 8 also shows an example selection of secondary conductors by way of solid boxes. These solid boxes correspond to the filled-in points of FIG. 7. To meet the specifications shown above in Table 1, only N=12 secondary conductors (and associated transconductance amplifiers) are needed, of which only M=6 are active.

Table 2 below shows the center positions and coupling factor values for each secondary conductor, which are taken from the graph 250 of FIG. 7, (circles circumscribed by squares). The subset of secondary conductors selected to produce the nominal relative sensitivity of 1.00 is shown as filled boxes in FIG. 8. Identifiers c1-c12 correspond to secondary conductor numbers shown below in Table 2.

TABLE 2

| Cond. | Center position | | Coupling factor, |
| --- | --- | --- | --- |
| | x | y | G/mA |
| $c_1$ | −2.25 | 1.25 | 0.4837 |
| $c_2$ | −1.25 | 1.25 | 0.6403 |
| $c_3$ | +0.75 | 1.25 | 0.6930 |
| $c_4$ | +1.75 | 1.25 | 0.5671 |
| $c_5$ | +3.75 | 1.25 | 0.2477 |
| $c_6$ | −2.25 | 2.75 | 0.3878 |
| $c_7$ | −1.25 | 2.75 | 0.4518 |
| $c_8$ | +1.75 | 2.75 | 0.4226 |
| $c_9$ | +3.75 | 2.75 | 0.2792 |
| $c_{10}$ | −1.25 | 4.25 | 0.3559 |
| $c_{11}$ | +0.75 | 4.25 | 0.3665 |
| $c_{12}$ | +2.75 | 4.25 | 0.3053 |

Table 3 below shows suitable secondary conductor selections for each trim code, along with the resulting coupling factor, $k_C$. These selections were obtained from a simple trial-and-error simulation. A particular value of coupling factor, $k_C$, is merely the sum of coupling factors of the selected secondary conductors associated with that particular code. A check mark in a column means that the secondary conductor is selected in conjunction with the trim code and associated row. The look-up table 108 of FIG. 3 implements the values of Table 3 as a truth table.

Figure 9:
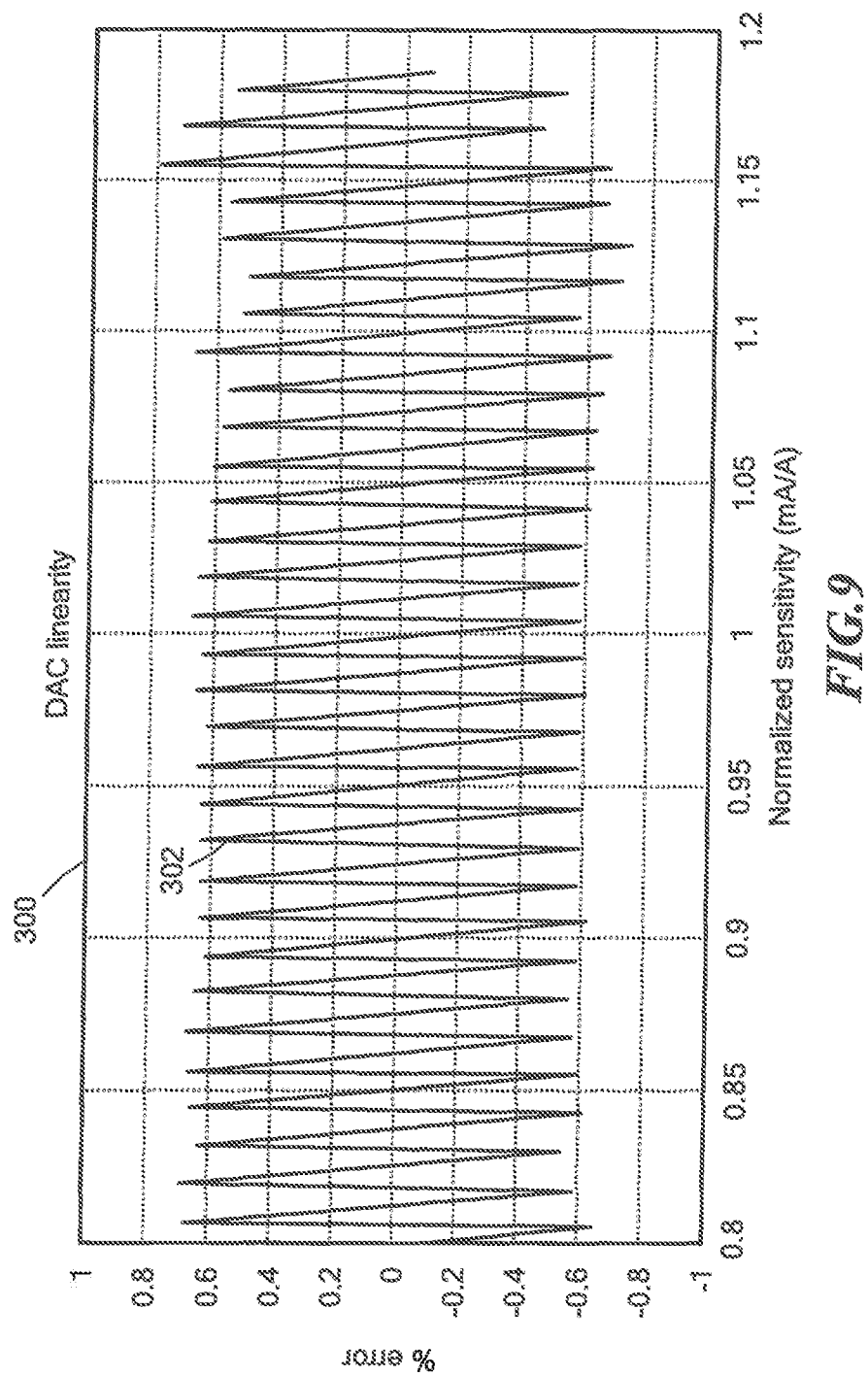
FIG. 9 is a graph showing a linearity error that can be achieved with an exemplary closed loop current sensor, such as the closed loop current sensor of FIG. 3.

Sensitivity values for uniformly-spaced trim codes are given, as well as an error of the designed system relative to a uniformly spaced design. Errors relative to a uniformly spaced design are small when compared with the +/−1% maximum error target. The trim-DAC (digital to analog converter) linearity plot shown below in FIG. 9 shows the expected error from trimming as a function of untrimmed sensitivity. The chosen example system has slightly non-uniform step sizes, but the maximum sensitivity trim error remains below the +/−1% target.

TABLE 3

| Trim code | Active coils | | | | | | | | | | | | $k_C$ (G/mA) | Relative sensitivity (mA/A) | | |
|---|---|---|---|---|---|---|---|---|---|---|---|---|---|---|---|---|
| | $c_1$ | $c_2$ | $c_3$ | $c_4$ | $c_5$ | $c_6$ | $c_7$ | $c_8$ | $c_9$ | $c_{10}$ | $c_{11}$ | $c_{12}$ | | Actual | Uniform | Error |
| 0  |   | ✓ | ✓ | ✓ |   | ✓ | ✓ |   |   | ✓ |   |   | 3.0959 | 0.799448 | 0.8    | −0.069% |
| 1  |   | ✓ | ✓ | ✓ |   |   |   | ✓ |   |   | ✓ | ✓ | 3.0454 | 0.812709 | 0.8125 | 0.026%  |
| 2  | ✓ | ✓ | ✓ | ✓ | ✓ |   |   |   |   |   | ✓ |   | 2.9982 | 0.825484 | 0.825  | 0.059%  |
| 3  |   | ✓ | ✓ | ✓ | ✓ |   | ✓ |   |   | ✓ |   |   | 2.9558 | 0.837327 | 0.8375 | −0.021% |
| 4  | ✓ | ✓ | ✓ |   |   |   |   | ✓ |   |   | ✓ | ✓ | 2.9113 | 0.850146 | 0.85   | 0.017%  |
| 5  |   | ✓ | ✓ |   |   |   | ✓ | ✓ |   | ✓ |   | ✓ | 2.8689 | 0.862712 | 0.8625 | 0.025%  |
| 6  |   | ✓ | ✓ |   |   | ✓ | ✓ | ✓ |   |   |   | ✓ | 2.8275 | 0.87533  | 0.875  | 0.038%  |
| 7  | ✓ | ✓ |   | ✓ |   |   | ✓ |   | ✓ |   | ✓ |   | 2.7885 | 0.887562 | 0.8875 | 0.007%  |
| 8  | ✓ | ✓ |   | ✓ |   | ✓ |   |   |   |   | ✓ | ✓ | 2.7506 | 0.8998   | 0.9    | −0.022% |
| 9  | ✓ |   | ✓ |   |   | ✓ | ✓ |   | ✓ |   |   | ✓ | 2.7122 | 0.912553 | 0.9125 | 0.006%  |
| 10 |   | ✓ | ✓ |   | ✓ |   |   |   |   | ✓ | ✓ | ✓ | 2.6755 | 0.925069 | 0.925  | 0.007%  |
| 11 | ✓ | ✓ |   |   |   |   |   | ✓ | ✓ | ✓ | ✓ |   | 2.6401 | 0.93747  | 0.9375 | −0.003% |
| 12 |   | ✓ | ✓ | ✓ |   | ✓ |   | ✓ | ✓ |   | ✓ |   | 2.6052 | 0.950021 | 0.95   | 0.002%  |
| 13 | ✓ |   | ✓ |   | ✓ |   | ✓ | ✓ |   |   |   | ✓ | 2.5714 | 0.962519 | 0.9625 | 0.002%  |
| 14 |   | ✓ |   | ✓ | ✓ |   | ✓ |   | ✓ |   |   | ✓ | 2.5389 | 0.974818 | 0.975  | −0.019% |
| 15 |   | ✓ |   |   | ✓ | ✓ | ✓ | ✓ |   | ✓ |   |   | 2.5061 | 0.987595 | 0.9875 | 0.010%  |
| 16 |   |   | ✓ |   | ✓ | ✓ | ✓ | ✓ |   |   | ✓ |   | 2.4749 | 1.000047 | 1      | 0.005%  |
| 17 |   | ✓ |   |   | ✓ |   | ✓ | ✓ | ✓ |   |   | ✓ | 2.4436 | 1.012839 | 1.0125 | 0.033%  |
| 18 | ✓ |   |   | ✓ | ✓ | ✓ |   | ✓ |   |   |   | ✓ | 2.4141 | 1.025226 | 1.025  | 0.022%  |
| 19 | ✓ |   |   |   |   | ✓ | ✓ |   |   | ✓ | ✓ | ✓ | 2.3857 | 1.037444 | 1.0375 | −0.005% |
| 20 | ✓ |   |   | ✓ |   |   |   |   | ✓ | ✓ | ✓ | ✓ | 2.3576 | 1.04981  | 1.05   | −0.018% |
| 21 |   |   | ✓ |   | ✓ | ✓ |   |   | ✓ | ✓ | ✓ |   | 2.3299 | 1.062264 | 1.0625 | −0.022% |
| 22 |   | ✓ |   |   | ✓ | ✓ |   |   |   | ✓ | ✓ | ✓ | 2.3034 | 1.074483 | 1.075  | −0.048% |
| 23 |   | ✓ |   |   | ✓ | ✓ |   |   | ✓ | ✓ | ✓ |   | 2.2773 | 1.086807 | 1.0875 | −0.064% |
| 24 | ✓ |   |   | ✓ | ✓ |   |   | ✓ |   |   | ✓ | ✓ | 2.2494 | 1.100307 | 1.1    | 0.028%  |
| 25 |   | ✓ |   |   | ✓ | ✓ |   |   |   | ✓ | ✓ | ✓ | 2.2267 | 1.111517 | 1.1125 | −0.088% |
| 26 |   |   |   |   | ✓ | ✓ | ✓ | ✓ | ✓ |   |   | ✓ | 2.2025 | 1.123738 | 1.125  | −0.112% |
| 27 | ✓ |   |   |   | ✓ | ✓ |   | ✓ | ✓ | ✓ |   |   | 2.1768 | 1.137015 | 1.1375 | −0.043% |
| 28 |   |   |   | ✓ | ✓ | ✓ |   |   | ✓ |   | ✓ | ✓ | 2.1535 | 1.149305 | 1.15   | −0.060% |
| 29 | ✓ |   |   |   | ✓ | ✓ |   | ✓ | ✓ |   |   | ✓ | 2.1261 | 1.16409  | 1.1625 | 0.137%  |
| 30 | ✓ |   |   |   | ✓ |   |   | ✓ | ✓ |   | ✓ | ✓ | 2.1048 | 1.17587  | 1.175  | 0.074%  |
| 31 |   |   |   |   | ✓ | ✓ |   |   | ✓ |   | ✓ | ✓ | 2.0857 | 1.186665 | 1.1875 | −0.070% |

Referring now to FIG. 9, a graph 300 has a horizontal axis with a scale representative of normalized sensitivity of a closed loop magnetic field sensor in units of milliamps per amp. This axis represents the sensitivity of the system before trimming, or the sensitivity of the system using a default secondary coil selection shown in FIGS. 7 and 8. Sensitivity before trimming can vary up to +/−20% for this example (from Table 1), due to fabrication process variations. The graph 300 has a vertical axis with a scale in units of percent error of the final trimmed sensitivity value with respect to the target sensitivity value. A curve 302 is representative of the error in sensitivity of the example system after trimming. The chosen example system has slightly non-uniform step sizes, as is evident from the non-uniform error across the entire untrimmed sensitivity range. However, the maximum sensitivity trim error remains below the +/−1% target. As stated previously, maximum trim error for uniform step sizes in this example is 0.625%. As seen in FIG. 9, this design only slightly exceeds this value as a result of the non-uniform step sizes.

Figure 10:
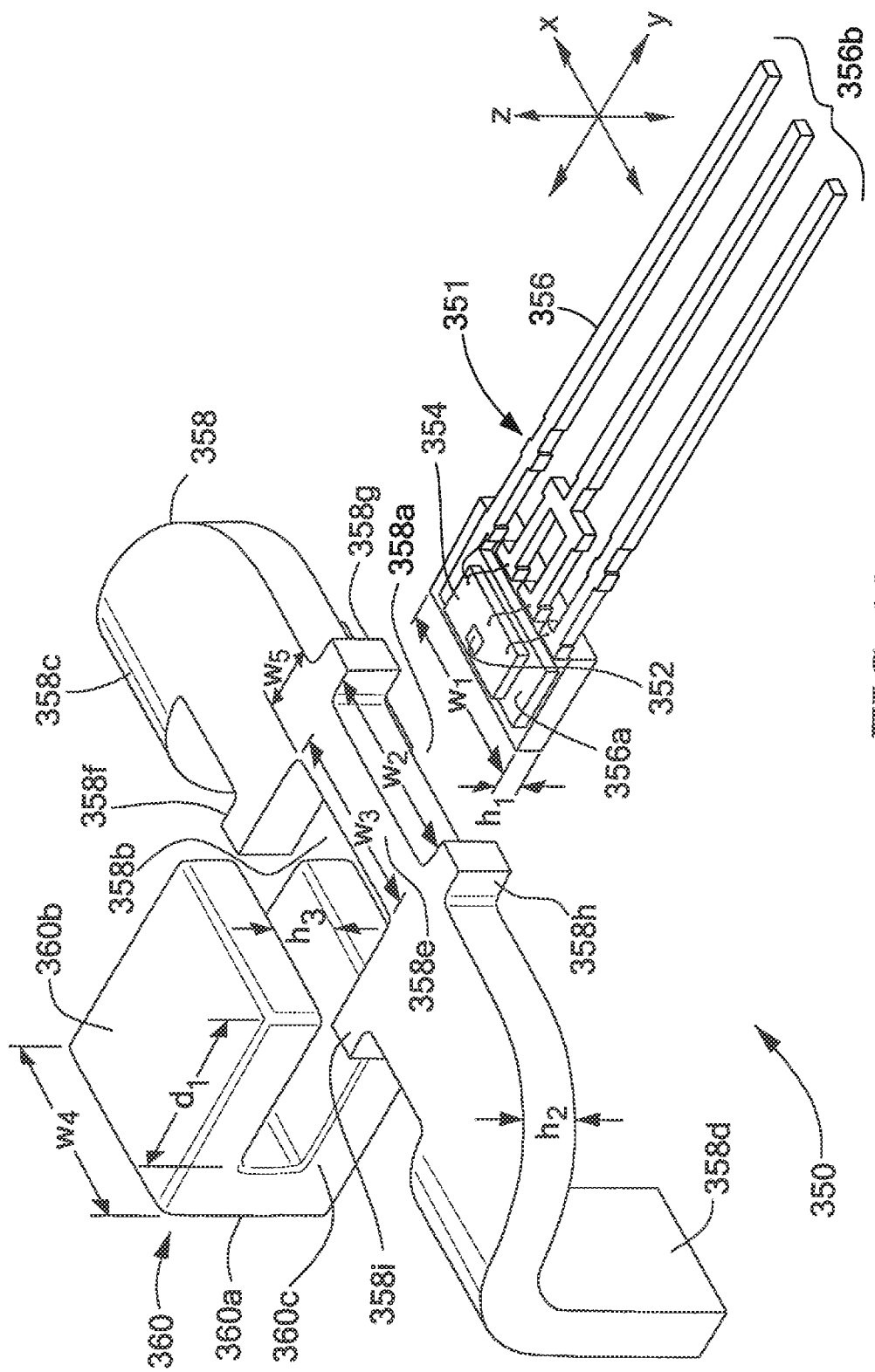
FIG. 10 is an exploded view of an exemplary current sensor having the plurality of secondary conductors as in FIG. 3.
Figure 11:
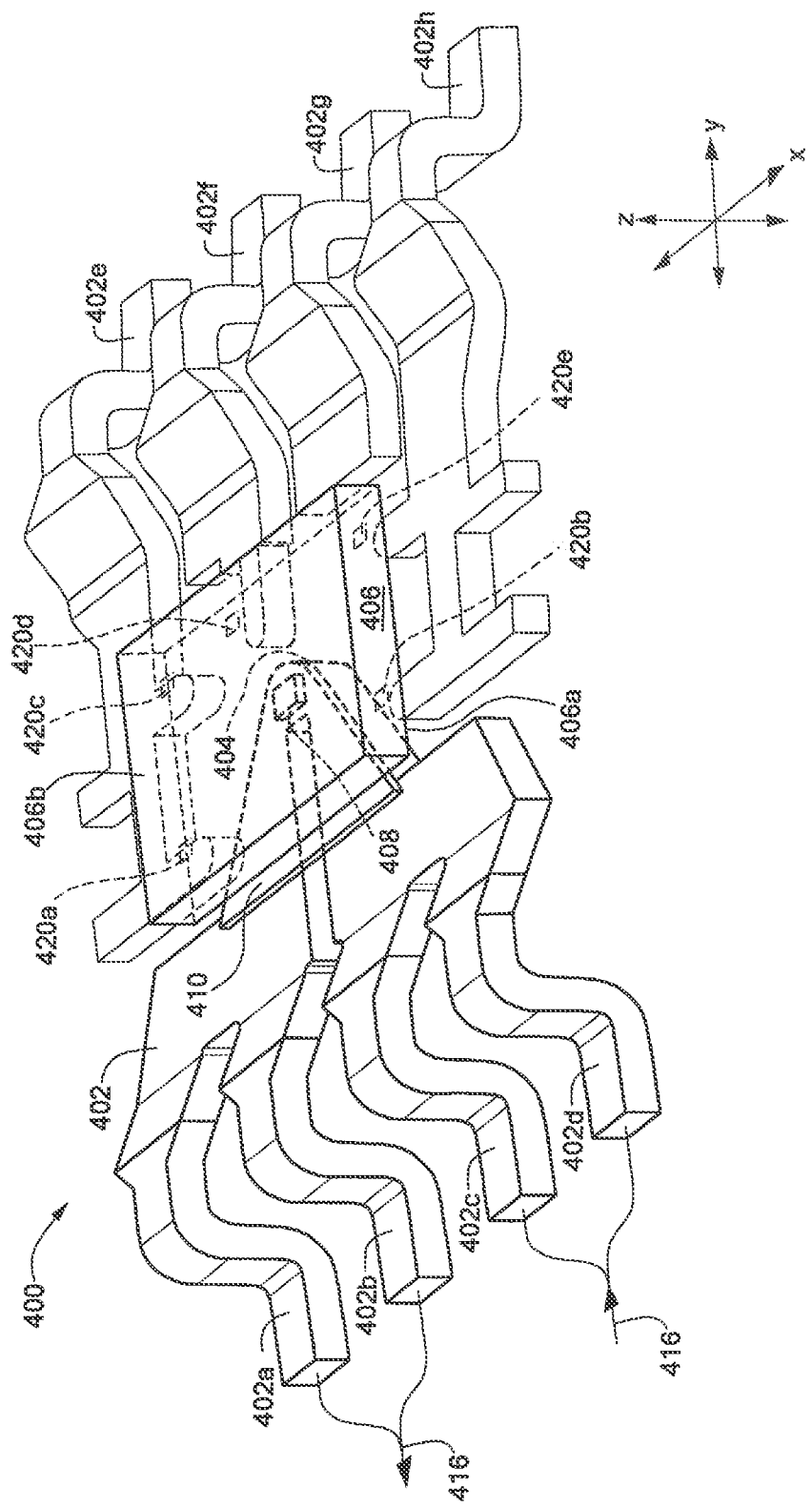
FIG. 11 is a pictorial view of another exemplary current sensor having the plurality of secondary conductors as in FIG. 3.
Figure 12:
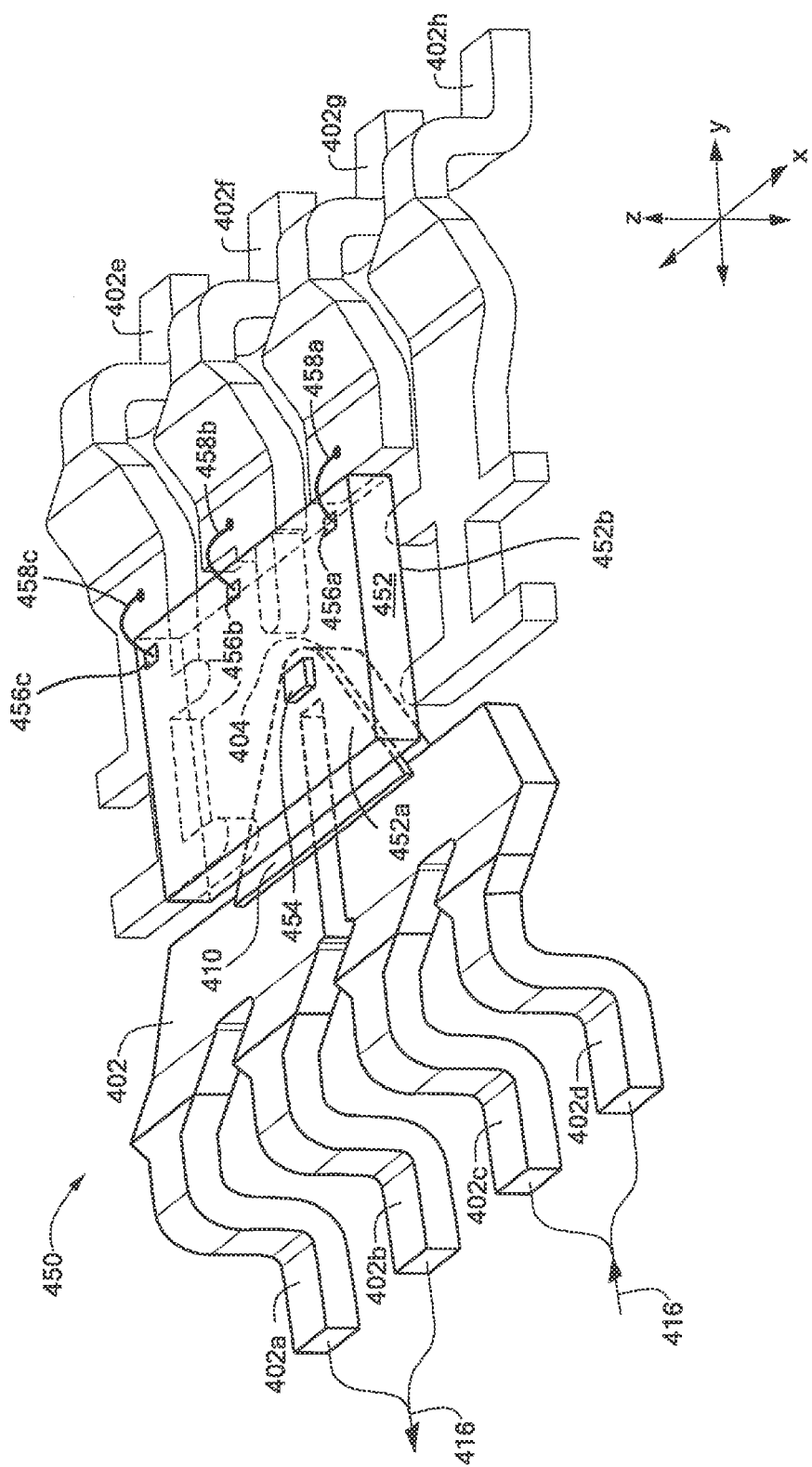
FIG. 12 is a pictorial view of yet another exemplary current sensor having the plurality of secondary conductors as in FIG. 3.

FIGS. 10-12 show various exemplary integrated circuits that can use the above circuits and techniques in respective closed loop current sensors. However, the above circuits and techniques can apply to other arrangements, including arrangements that are not integrated into a common integrated circuit.

Referring now to FIG. 10, a current sensor 350 (here shown in exploded form) includes a magnetic field sensing element, here in the form of a magnetoresistance element 352, disposed upon a substrate 354. The substrate 354 is disposed upon a base plate 356a of a leadframe 356 and coupled to leads 356b. The substrate 354, together with the magnetic field sensing element and with the leadframe 356, form a magnetic field sensor 351.

A current-carrying (i.e., primary) conductor 356 is disposed proximate to the magnetic field sensor 351. A ferromagnetic core 360 is disposed proximate to the primary conductor 358 and proximate to the magnetic field sensor 351. The primary conductor 358 passes a current that is to be sensed.

The primary conductor 358 can include features for receiving portions of the magnetic field sensor 351 and/or the ferromagnetic core 360 such that the elements are maintained in a fixed position relative to each other. In the illustrated embodiment, the primary conductor 358 has a first notch 358a and a second notch 358b substantially aligned with the first notch. When assembled, at least a portion of the magnetic field sensor 351 is disposed in the first notch 358a.

The ferromagnetic core 360 can be substantially C-shaped and can have a central region 360a and a pair of substantially parallel legs 360b, 360c extending from the central region 360a. When assembled, at least a portion of the central region 360a is disposed in the second notch 358b of the conductor 358 such that each one of the legs 358b, 358c covers at least a portion of a respective surface of the magnetic field sensor 351.

The magnetic field sensor 351 can be encapsulated with an electrically insulating material. The magnetic field sensor 351 can be provided in different package types, such as the "K" single in line (SIP) package having a thickness on the order of 1.6 mm. An effective air gap between the primary conductor 358 and the magnetic field sensing element 352 is equal to the thickness of the package, with the substrate 354 resting approximately in the center of the air gap.

The leads 356b can be configured for mounting to a printed circuit board (not shown).

The substrate 354 can also include 14 include circuitry thereon, which can include an electronic circuit the same as or similar to the electronic circuit 100 described above in conjunction with FIG. 3, including the plurality of secondary conductors 114.

It will be appreciated that other types of magnetic field sensing elements, such as a Hall Effect element, may alternatively be used.

The primary conductor 358 can be comprised of various conductive materials, such as copper, and is adapted for mounting to a printed circuit board through which the measured current is provided to the conductor 358. To this end, the primary conductor 358 can have bent leads or tabs 358c, 358d, suitable for soldering to a circuit board. Mechanisms other than the bent tabs 358c, 358d may be used to mount the current sensor 350 to a circuit board, such as screw terminals and associated hardware or flat leads or tabs. In alternate embodiments, the same or other mounting mechanisms can be used to allow the current sensor 350 to be mounted to other than a circuit board. For example, in other embodiments, the current sensor 350 can have wire couplings (not shown) that allow the current sensor 350 to be coupled in series with a wire.

Preferably, the primary conductor 358 (excluding the bent tabs 358d, 358d) is substantially planar as shown, without features extending in a z-axis, which would otherwise increase the height of the current sensor 350 off of the printed circuit board. In use, to major plane of the conductor 358 is positioned close to the printed circuit board plane, thereby providing a low profile current sensor.

The first notch 358a of the primary conductor 358 has a width w2 selected to receive at least a portion of the magnetic field sensor 351, which has a width w1. Preferably, the width w1 and the width w2 are sufficiently similar so that, when assembled, the possible movement of the magnetic field sensor 351 relative to the primary conductor 358 in the x-axis is negligible. More specifically, the nominal width w1 is slightly smaller than the nominal width w2, such as by approximately 0.28 mm, so that, with worst case tolerances, the largest width w1 is 0.4 mm smaller than the smallest width w2. In the illustrated embodiment, nominal width w1 is 5.18 mm and nominal width w2 is 5.46 mm. Widths w1 and w2 can thus be characterized as being substantially equal.

The second notch 358b of the primary conductor 358 has a width w3 selected to receive at least a portion of the ferromagnetic core 360. Preferably, the width w3 and the width w4 of the central region 360a of the ferromagnetic core 360 are sufficiently similar, so that, when assembled, any possible movement of the ferromagnetic core 360 relative to the primary conductor 358 in the x-axis is negligible. More specifically, nominal width w4 is slightly smaller than nominal width w3, such as by approximately 0.2 mm, so that, with worst case tolerances, the smallest width w4 is 0.34 mm smaller than the largest width w3 and the largest width w4 is 0.08 mm smaller than the smallest width w3. In the illustrated embodiment, nominal width w3 is 5.46 mm and nominal width w4 is 5.25 mm. Widths w3 and w4 can thus be characterized as being substantially equal.

The spacing h3 between ferromagnetic core legs 360b, 360c, the thickness or height h2 of the primary conductor 358 and the thickness or height h1 of the magnetic field sensor 351 are all substantially similar so that possible movement of the components relative to each other in the z-axis is restricted. More specifically, nominal conductor height h2 and sensor height h1 are slightly smaller than nominal height h3, such as by approximately 0.1 mm, so that, with worst case tolerances, the smallest height h1 and height h2 are 0.22 mm smaller than the largest height h3 and the largest height h1 and height h2 are 0.01 mm smaller than the smallest height h3. In the illustrated embodiment, the nominal height h1 is 1.55 mm, the nominal height h2 is 1.50 mm, and the nominal height h3 is 1.64 mm.

In other embodiments, however, the spacing h3 is selected in accordance with other factors. For example, in one alternate embodiment, the spacing h3 is substantially larger than the height h1 of the magnetic field sensor 351 in order to increase a reluctance and, therefore, to increase the current through the primary conductor 358 that would saturate the magnetic field sensor 351. Thus, this alternate embodiment has a greater current carrying capacity.

The ferromagnetic core 360 tailors the magnetic field across the magnetic field sensing element 352 and may be referred to alternatively as a magnetic field concentrator. The ferromagnetic core 360 may be comprised of various materials including, but not limited to ferrite, steel, iron compounds, and Permalloy. The material of the ferromagnetic core 360 is selected based on factors such as maximum measured current and the desired amount of magnetic shielding provided by the C-shaped ferromagnetic core 360. Other factors include stability of the relative permeability over temperature and hysteresis (magnetic remanence). For example, a low hysteresis ensures greater accuracy for small currents through the primary conductor 358. The material and size of the ferromagnetic core 360 are also selected in accordance with the desired full scale current through the primary conductor 358, wherein a ferromagnetic core material with a higher saturation flux density (Bsat) allows the use of a smaller core for a given current flowing through the primary conductor 360. Use of the ferromagnetic core 360 can significantly reduce susceptibility of the current sensor 350 to stray magnetic fields.

The ferromagnetic core 360 has a depth d1, selected so that each of the legs 360b, 360c substantially covers an entire respective surface of the substrate 354. With this arrangement, a substantially uniform magnetic field is provided across the magnetic field sensing element 352, thereby increasing device sensitivity and reducing susceptibility to stray magnetic fields.

The notches 358a, 358b can be formed by radial tabs 358f, 358g, 358h, 358i. A space between the notches 358a, 358b forms a narrowed region 358e. The width w5 of the narrowed region 358e is selected based on the maximum desired current carrying capability of the primary conductor 358. Here, the width w5 is on the order 1.7 mm and the current carrying capability of the primary conductor 358 is on the order of one hundred Amperes.

Although the notches 358a, 358b could be formed by radial tabs 358f, 358g, 358h, 358i respectively, without providing the narrowed conductor region 358e, the use of the narrowed region 358e can reduce the overall dimension of the current sensor 350 along the y-axis. The narrowed region 358e also provides the current through the primary conductor 358 in closer proximity to the magnetic field sensor. In an alternate embodiment, the notches 358a, 358b are formed without the tabs 358r, 358g, 358h, 358i, and are provided only by the narrowed region 358e.

It will be understood that, in other embodiments, the magnetic field sensor 351 can be disposed at a different positions relative to the primary conductor 358. For example, where the magnetic field sensing element 352 is a magnetoresistance element with an axis of sensitivity aligned in the y direction, it may be desirable to position the magnetic field sensor aligned with the primary conductor 358.

Referring now to FIG. 11, another exemplary current sensor 400 includes a lead frame 402 having a plurality of leads 402a-402h. The leads 402a, 402b are electrically coupled to the leads 402c, 402d to form a current path, or primary conductor, with a narrow portion 404. The current sensor 400 also includes a substrate 406 having a first surface 406a and a second, opposing surface 406b. A magnetic field sensing element 408 is disposed upon or in the first surface 406a. The substrate 406 can be comprised of a semiconductor material, e.g., silicon, or, in an alternate embodiment, the substrate 406 can be comprised of an insulating material.

The substrate 406 is disposed above the lead frame 402 so that the first surface 406a is proximate to the current conductor portion 404 and the second surface 406b is distal from the current conductor portion 404 and more specifically, so that the magnetic field sensing element is in close proximity to the current conductor portion 404. In the illustrated embodiment, the substrate 406 has an orientation that is upside down (i.e., the first surface 406a is directed downward) relative to a conventional orientation with which a substrate is mounted in an integrated circuit package. This orientation results in a so-called "flip-chip" arrangement.

The substrate 406 has bonding pads 420a-420c on the first surface 406a. The bonding pads wires are coupled to the leads 402e, 402f, 402g, 402h of the lead frame 402.

An insulator 410 separates the substrate 406 from the lead frame 402. The insulator 410 can be provided in a variety of ways. For example, in one embodiment, a first portion of the insulator 410 includes a four µm thick layer of a BCB resin material deposited directly on the first surface 406a of the substrate 406. A second portion of the insulator 410 includes a layer of Staychip™ NUF-2071 E underfill material (Cookson Electronics Equipment, New Jersey) deposited on the leadframe 402. Such an arrangement provides more than one thousand volts of isolation between the substrate 406 and the leadframe 402.

It will be understood that the primary conductor 404 is but a part of the total path through which an electrical current flows. For example, a current having a direction depicted by arrows 416 flows into the leads 402c, 402d, which are here shown to be electrically coupled in parallel, through the primary conductor 404, and out of the leads 402a, 402b, which are also shown here to be electrically coupled in parallel.

With this arrangement, the magnetic field sensing element 408 is disposed in close proximity to the primary conductor 404 and at a predetermined position relative to the primary conductor 404, such that a magnetic field generated by an electrical current passing though the current conductor portion 404 is in a direction substantially aligned with a maximum response axis of the magnetic field sensing element 404. The magnetic field sensing element 404 generates a voltage output proportional to the magnetic field and therefore proportional to the current flowing through the primary current conductor 404.

The illustrated magnetic field sensing element 404 has a maximum response axis substantially aligned with a y-axis. Because the magnetic field generated in response to the current is circular about the primary current conductor 404, the magnetic field sensing element 404 is disposed over the primary conductor 404, where the magnetic field is pointed substantially along the y-axis. This position results in a greater voltage output from the magnetic field sensing element 404, and therefore improved sensitivity. However, a Hall effect element, or another type of magnetic field sensor having maximum response axis aligned in another direction, can be disposed at another position relative to the primary conductor 404, for example, to the side of the primary conductor 404.

Other circuitry (not shown) can be disposed upon the first or second side of the substrate. The other circuitry can be the same as or similar to the electronic circuit described above in conjunction with FIG. 3, including the plurality of secondary conductors 114.

While one magnetic field sensing element 404 is shown on the first surface 406a of the substrate 406, it will be appreciated that more than one magnetic field sensing element can be used.

The close proximity between the magnetic field sensing element 404 and the primary conductor 404 is achieved by providing the magnetic field sensing element 404 on the first substrate surface 406a, which is positioned closer to the primary conductor 404 than the second surface 406b. In other embodiments, this advantageous close proximity is achieved by providing the magnetic field sensing element 404 on the second substrate surface 406b and forming the primary conductor 404 so as to be in substantial alignment with the second surface 406b.

The insulating layer 410 can extend as shown beyond and edge of the substrate 406. As is known, the edge of a substrate can have sharp edges and irregularities that can be prevented from touching the leadframe by way of the extension of the insulating layer 410.

In some embodiments, the insulating layer 410 is an interposing insulating layer, for example a ceramic layer. In other embodiments, the insulating layer 410 is a substrate insulating layer associated with the substrate, in other embodiments, the insulating layer 410 is a lead frame insulating layer associated with the lead frame 402. It will be appreciated that, when associated with the lead frame or with the substrate, as described above, the insulating layer 410 can extend beyond the substrate 406 in a direction along the y-axis. This arrangement provides enhanced reliability, since an edge of the substrate 406 is less likely to contact the lead frame 402.

In some embodiments for which the insulating layer 410 is a substrate insulating layer associated with the substrate 406, the insulating layer 410 is a substrate taped insulating layer formed with a taping process upon the substrate 406. The substrate taped insulating layer can be comprised of a tape applied to the lead frame, including but not limited to, a polymer tape, for example, a Kapton® tape.

In some embodiments for which the insulating layer 410 is a lead frame insulating layer associated with the lead frame 402, the insulating layer 410 is a lead frame taped insulating layer formed with a taping process upon the leadframe 402. The lead frame taped insulating layer can be comprised of a tape applied to the lead frame, including but not limited to, a polymer tape, for example, a Kapton® tape.

In other embodiments for which the insulating layer 410 is a lead frame insulating layer associated with the lead frame 402, the insulating layer 410 is a lead frame sprayed insulating layer formed with a spraying process. The lead frame sprayed insulting layer can be comprised of a variety of materials, including but not limited to a polymer, for example, a polyimide (e.g., trade name Pyralin®), a bisbenzocyclobutene (BCB) (e.g., trade name Cyclotene®) a sprayed dielectric, (e.g., trade names 3M Scotch® Insulating Spray 1601 and Loctite® ShadowCure® 3900), or a spray ceramic coating.

In other embodiments for which the insulating layer 410 is a lead frame insulating layer associated with the lead frame 402, the insulating layer 410 is a lead frame deposited insulating layer formed with a deposition process. The lead frame deposited insulating layer can be formed with a variety of processes, including, but not limited to a screen printing process. The screen printing process can result in a lead frame deposited insulting layer comprised of a variety of materials, including but not limited to, polymers or ceramics. In still other embodiments, the lead frame deposited insulating layer is formed with a vacuum deposition process. For these embodiments, the lead frame deposited insulating layer can be comprised, for example, of a polymer, for example, parylene.

In still other embodiments for which the insulating layer 410 is a lead frame insulating layer associated with the lead frame 402, the insulating layer 410 is a lead frame oxide insulating layer formed with an oxide generation process. The lead frame oxide insulating layer can be comprised, for example, of a sputtered oxide layer disposed onto the lead frame 402.

Referring now to FIG. 12, in which like elements of FIG. 11 are shown having like reference designations, a current sensor 450 is like the current sensor 400 of FIG. 11, except a substrate 452 is conventionally mounted such that a magnetic field sensing element 454 is upward and distal from the leadframe 402. Bonding pads 456a, 456b, 456c are coupled with wire bonds 458a, 458b, 458c to leads 402e, 402f, 402g.

Like the magnetic field sensor 400, the current sensor 450 can include electronics disposed upon one of the surfaces of the substrate 452, which can be the same as or similar to the electronic circuit 100 of FIG. 3, including the plurality of secondary conductor 114.

All references cited herein are hereby incorporated herein by reference in their entirety.

Having described preferred embodiments, which serve to illustrate various concepts, is structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. An electronic circuit for measuring a sensed current, comprising:
 a primary current conductor for carrying the sensed current;
 a magnetic field sensing element disposed proximate to the primary conductor, wherein the sensed current passing through the primary conductor results in a first magnetic field at the magnetic field sensing element;
 a plurality of secondary conductors disposed proximate to the magnetic field sensing element, each at a different position relative to the magnetic field sensing element;
 a plurality of drive circuits, each one of the plurality of drive circuits coupled to a respective one of the plurality of secondary conductors; and
 a selection circuit coupled to the plurality of drive circuits and operable to select ones of the plurality of drive circuits causing the selected drive circuits to drive respective currents through respective selected ones of the plurality of secondary conductors, wherein the currents passing through the selected ones of the plurality of secondary conductors result in a second magnetic field at the magnetic field sensor, wherein a magnitude of the second magnetic field is related to the selection made by the selection circuit, wherein the magnetic field sensor is responsive to a summed magnetic field corresponding to a sum of the first and second magnetic fields, and wherein the selection made by the selection circuit results in a selected sensitivity of the magnetic field sensor to the sensed current.

2. The electronic circuit of claim 1, wherein the secondary currents passing through the selected ones of the plurality of secondary conductors are proportional to the sensed current.

3. The electronic circuit of claim 1, wherein the magnetic field sensing element has a maximum response axis and wherein a maximum value of the summed magnetic field is selected to be within a linear range of the magnetic field sensing element.

4. The electronic circuit of claim 2, wherein the magnetic field sensing element is coupled in a feedback arrangement to the plurality of drive circuits.

5. The electronic circuit of claim 1, wherein the magnetic field sensing element is coupled in a feedback arrangement to the plurality of drive circuits.

6. The electronic circuit of claim 1, wherein a total quantity of the selected secondary conductors is less than a total number of the plurality of secondary conductors.

7. The electronic circuit of claim 1, wherein the plurality of drive circuits comprises a respective plurality of field effect transistor (FET) current generators, each having a respective transconductance.

8. The electronic circuit of claim 6, wherein the plurality of FET current generators each have the same transconductance.

9. The electronic circuit of claim 1, further comprising a substrate having one or more metal layers, wherein the primary conductor is formed within the one or more metal layers, and wherein magnetic field sensing element is disposed proximate to the primary conductor in an integrated circuit.

10. The electronic circuit of claim 9, wherein the plurality of drive circuits and the selection circuit are disposed over or within the substrate in the integrated circuit.

11. The electronic circuit of claim 9, wherein the magnetic field sensing element comprises a magnetoresistance element.

12. The electronic circuit of claim 9, wherein the magnetic field sensing element comprises a Hall element.

13. The electronic circuit of claim 9, further comprising a leadframe coupled to the substrate in the integrated circuit, wherein the wherein the leadframe comprises the primary conductor.

14. The electronic circuit of claim 9, further comprising a leadframe coupled to the substrate in the integrated circuit, wherein the substrate is disposed in a flip-chip arrangement with the lead frame.

15. The electronic circuit of claim 1, wherein the selection circuit comprises a programmable device coupled to the plurality of drive circuits and configured to store a value indicative of the selection of the ones of the plurality of drive circuits.

16. The electronic circuit of claim 15, wherein the programmable device comprises an EEPROM.

17. The electronic circuit of claim 15, wherein the programmable device comprises a plurality of fusible links.

18. The electronic circuit of claim 1, further comprising a circuit board having one or more metal layers, wherein the primary conductor is formed within the one or more metal layers, and wherein magnetic field sensing element is disposed proximate to the primary conductor.

19. A method of measuring a sensed current, comprising:
 providing, in an integrated circuit, a magnetic field sensing element;

providing a primary current conductor for carrying the sensed current; wherein the sensed current passing through the primary conductor results in a first magnetic field at the magnetic field sensing element;

providing a plurality of secondary conductors disposed proximate to the magnetic field sensing element, each at a different position relative to the magnetic field sensing element;

providing, in the integrated circuit, a plurality of drive circuits, each one of the plurality of drive circuits coupled to a respective one of the plurality of secondary conductors;

providing, in the integrated circuit, a selection circuit coupled to the plurality of drive circuits; and selecting, with the selection circuit, ones of the plurality of drive circuits causing the selected drive circuits to drive respective secondary currents through respective selected ones of the plurality of secondary conductors, wherein the secondary currents passing through the selected ones of the plurality of secondary conductors result in a second magnetic field at the magnetic field sensor, wherein a magnitude of the second magnetic field is related to the selection made by the selection circuit, wherein the magnetic field sensor is responsive to a summed magnetic field corresponding to a sum of the first and second magnetic fields, and wherein the selection made by the selection circuit results in a selected sensitivity of the magnetic field sensor to the sensed current.

20. The method of claim 19, wherein the secondary currents passing through the selected ones of the plurality of secondary conductors are proportional to the sensed current.

21. The method of claim 19, wherein the providing the primary conductor comprises providing a leadframe, wherein the leadframe comprises the primary conductor.

22. The method of claim 19, wherein the providing the plurality of secondary conductors comprises providing, in the integrated circuit, the plurality of secondary conductors.

23. The method of claim 19, wherein the providing the plurality of secondary conductors comprises providing, upon a circuit board, the plurality of secondary conductors.

24. The method of claim 19, wherein the magnetic field sensing element comprises a magnetoresistance element.

25. The method of claim 19, wherein the magnetic field sensing element comprises a Hall element.

26. The method of claim 19, further comprising, providing a leadframe coupled to a substrate in the integrated circuit, wherein the substrate is disposed in a flip-chip arrangement with the lead frame.

27. The method of claim 19, further comprising:
providing, in the integrated circuit, a memory device, wherein the selecting comprises programming the programmable device to retain selection data.

28. The electronic circuit of claim 27, wherein the programmable device comprises an EEPROM.

29. The electronic circuit of claim 27, wherein the programmable device comprises a plurality of fusible links.

* * * * *

UNITED STATES PATENT AND TRADEMARK OFFICE
CERTIFICATE OF CORRECTION

| | | |
|---|---|---|
| PATENT NO. | : 8,907,669 B2 | Page 1 of 2 |
| APPLICATION NO. | : 13/556663 | |
| DATED | : December 9, 2014 | |
| INVENTOR(S) | : Craig S. Petrie | |

It is certified that error appears in the above-identified patent and that said Letters Patent is hereby corrected as shown below:

IN THE SPECIFICATION

Column 1, Line 41 delete "dosed" and replace with --closed--.

Column 1, Line 45 delete "stun" and replace with --sum--.

Column 4, Line 24 delete "folly" and replace with --fully--.

Column 5, Line 31 delete "element" and replace with --elements--.

Column 5, Line 32 delete "Retelling" and replace with --Referring--.

Column 5, Line 44 delete "straight-fine" and replace with --straight-line--.

Column 6, Line 45 delete "ones the" and replace with --ones of the--.

Column 7, Line 47 delete "signal the 102." and replace with --the signal 102.--.

Column 8, Line 49 delete "they" and replace with --the y--.

Column 9, Line 40 delete "vertical, axis" and replace with --vertical axis--.

Column 13, Line 6 delete "include 14 include" and replace with --include--.

Column 13, Line 33 delete ", to major" and replace with --, a major--.

Column 14, Line 52 delete "order 1.7mm" and replace with --order of 1.7mm--.

Column 14, Line 63 delete "358r," and replace with --358f,--.

Column 14, Line 66 delete "positions" and replace with --position--.

Column 15, Line 28 delete "pads" and replace with --pad--.

Signed and Sealed this
Ninth Day of February, 2016

Michelle K. Lee
*Director of the United States Patent and Trademark Office*

IN THE SPECIFICATION

Column 15, Line 52 delete "though" and replace with --through--.

Column 16, Line 25 delete "and" and replace with --an--.

Column 16, Line 33 delete ", in other" and replace with --. In other--.

Column 17, Line 35 delete ", is structures" and replace with --, structures--.

Column 17, Line 39 delete "that that" and replace with --that the--.

IN THE CLAIMS

Column 18, Line 45 delete "wherein the wherein the" and replace with --wherein the--.